(12) United States Patent
Hosoba et al.

(10) Patent No.: US 6,433,364 B2
(45) Date of Patent: Aug. 13, 2002

(54) SEMICONDUCTOR LIGHT EMITTING DEVICE CAPABLE OF INCREASING LIGHT EMITTING EFFICIENCY

(75) Inventors: Hiroyuki Hosoba, Souraku-gun; Hiroshi Nakatsu, Tenri; Takahisa Kurahashi, Kashiba; Tetsurou Murakami, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/819,858

(22) Filed: Mar. 29, 2001

(30) Foreign Application Priority Data

Apr. 6, 2000 (JP) ........................................ 2000-104919

(51) Int. Cl.[7] .................. H01L 27/15; H01L 31/12; H01L 33/00
(52) U.S. Cl. .................. 257/80; 257/76; 257/87
(58) Field of Search ..................... 257/80, 94, 103, 257/76, 87

(56) References Cited

U.S. PATENT DOCUMENTS

| | | | | |
|---|---|---|---|---|
| 5,381,024 A | * | 1/1995 | Valster | 257/97 |
| 5,777,349 A | * | 7/1998 | Nakamura et al. | 257/94 |
| 5,869,849 A | * | 2/1999 | Jou et al. | 257/96 |
| 6,081,540 A | * | 6/2000 | Nakatsu | 257/103 |
| 6,107,647 A | * | 8/2000 | Matsumoto et al. | 257/94 |
| 6,198,112 B1 | * | 3/2001 | Ishida et al. | 257/103 |
| 6,246,078 B1 | * | 6/2001 | Sasaki et al. | 257/96 |
| 6,265,732 B1 | * | 7/2001 | Nakatsu et al. | 257/103 |

FOREIGN PATENT DOCUMENTS

JP 2-2714885 11/1997

* cited by examiner

*Primary Examiner*—Hoai V. Ho
*Assistant Examiner*—Andy Huynh
(74) *Attorney, Agent, or Firm*—Nixon & Vanderhye P.C.

(57) ABSTRACT

On an n-GaP substrate transparent against a radiation light of an InAlGaP based semiconductor element, a lattice distortion relaxation layer, a clad layer 13, an active layer, and a clad layer are created with InAlGaP. On top of the layers, there is formed an $In_xGa_{1-x}P$ current diffusion layer with In composition ratio x equal to (0<X<1). Through these steps, uneven depth on the crystal surface is decreased and crystal defect concentration is lowered. In addition, the energy gap of the current diffusion layer is made larger than the energy gap of the active layer, so that the GaP substrate and the uppermost InGaP current diffusion layer become transparent against a radiation light from the active layer, resulting in increased light emitting efficiency. Further, simple formation of layers from the lattice distortion relaxation layer to the current diffusion layer in sequence enables reduction of the production costs.

20 Claims, 6 Drawing Sheets

(100) PLANE

PLANE THE NORMAL OF WHICH INCLINES WITH RESPECT TO THE NORMAL OF THE (100) PLANE TOWARD [011] DIRECTION

SEMICONDUCTOR LIGHT EMITTING DEVICE CAPABLE OF INCREASING LIGHT EMITTING EFFICIENCY

BACKGROUND OF THE INVENTION

The present invention relates to an AlGaInP-based compound semiconductor light emitting device formed on a GaP substrate.

Semiconductor elements using AlGaInP based semiconductor materials have been used as light emitting devices in a visible area since they allows lattice-matching with a GaAs substrate and have a largest direct transition band gap among III-V group compound semiconductors. In particular, as light-emitting devices, the semiconductor elements using AlGaInP based semiconductor materials perform direct transition-type light emission in the range from 550 nm to 690 nm, which brings about high light emitting efficiency. However, when the GaAs substrate is used, they serve not as a transparent layer but as a photoabsorption layer against a radiation light. Consequently, in the case where plane emission-type AlGaInP based semiconductor elements are used, high luminance can not be achieved.

To solve this problem, there has been proposed an architecture in which an AlGaInP based semiconductor light emitting device is placed not on the GaAs substrate but on a GaP substrate transparent against a radiation light of the AlGaInP based semiconductor element (as shown in Japanese Patent Laid-Open Publication No. 2714885).

The following description discusses the AlGaInP based semiconductor light emitting device formed on the GaP substrate with reference to FIG. 10. The AlGaInP based semiconductor light emitting device formed on the GaP substrate is formed through the following steps.

First, as shown in FIG. 10A, an AlGaInP clad layer 2, an AlGaInP active layer 3, and an AlGaInP clad layer 4 are formed in sequence on a GaAs substrate 1 by a MOCVD (metal-organic chemical vapor deposition) method. Next, as shown in FIG. 10B, a GaP layer 5 is formed by a LPE (liquid-phase epitaxy) process utilizing yo-yo solute supply method or temperature difference method. Then, as shown in FIG. 10C, the GaAs substrate 1, which serves as a photoabsorption layer, is removed. After the GaAs substrate 1 is removed, a GaP current diffusion layer 6 is formed on the AlGaInP clad layer 2 by the LPE process utilizing yo-yo solute supply method or temperature difference method. Through the steps stated above, an AlGaInP based semiconductor light emitting device is formed on the GaP layer 5 as a substrate.

In the AlGaInP based semiconductor light emitting device formed on the GaP substrate shown in FIGS. 10A to 10D, current is diffused by the GaP current diffusion layer 6 and light is emitted in the wide range of the active layer 3, which results in increased light emitting efficiency. In addition, the GaP layer 5 and the GaP current diffusion layer 6 are larger in the band gap than the AlGaInP active layer 3, so that the emitted light is transmitted without being absorbed, which implements high light emitting efficiency.

However, the prior art AlGaInP based semiconductor light emitting device formed on the GaP substrate has a problem stated below. That is, as large as four steps are required to produce an AlGaInP based semiconductor light emitting device. More particularly, AlGaInP based light emitting portions 2 to 4 are formed on a GaAs substrate 1 in the first production step, a GaP layer 5 is formed thereon by the LPE process utilizing yo-yo solute supply method or temperature difference method in the second step, the GaAs substrate 1 is removed by etching in the third step, and thereafter a GaP current diffusion layer 6 is formed by the LPE process utilizing yo-yo solute supply method or temperature difference method in the fourth step. This causes substantial increase of the production costs.

Further, the GaAs substrate 1 is used and removed in the production process, which causes further increase of the production costs.

Accordingly, in order to avoid the step of removing the GaAs substrate 1, an inventor made a trial of creating the AlGaInP based light emitting portions and the GaP current diffusion layer directly on the GaP substrate by the MOCVD method. In this case, the AlGaInP based semiconductor light emitting device can be produced by one growth step so that the GaAs substrate is not necessary, which enables substantial decrease of the production costs. However, the result of the trail disclosed that the AlGaInP based light emitting portions having lattice mismatch are created on the GaP substrate, and further thereon the GaP current diffusion layer having lattice mismatch is created, so that crystallinity of the GaP current diffusion layer is degraded, which creates uneven surface and generates a number of crystal defects.

SUMMARY OF THE INVENTION

Accordingly, it is an object of the present invention to provide a semiconductor light emitting device, enabling substantial decrease of the production costs, having a good crystalline current diffusion layer, and implementing considerable increase of light emitting efficiency.

In order to achieve the above object, there is provided a semiconductor light emitting device comprising: a light emitting portion made up of at least an active layer and clad layers; and a current diffusion layer formed above a GaP substrate, wherein the current diffusion layer is defined as $In_xGa_{1-x}P(0<X<1)$ where a composition ratio of In equals to X.

According to the above structure, the $In_xGa_{1-x}P$ current diffusion layer formed on top of the layers has the In composition ratio X equal to (0<X<1) Consequently, the uneven depth of the crystal surface is considerably diminished, and the crystal defect concentration is substantially decreased. As a result, a current diffusion layer with good crystallinity can be obtained. In addition, $In_xGa_{1-x}P$ is used as the current diffusion layer, so that in the case where the active layer is composed of an AlGaInP based semiconductor, the light emitted in the active layer is absorbed neither by the GaP substrate nor by the current diffusion layer, which implements substantial improvement of light emitting efficiency. Further, the light emitting device can be produced simply by forming each layer in sequence on the GaP substrate, which contributes to reduction of the production costs.

Also, there is provided a semiconductor light emitting device comprising: a light emitting portion made up of at least an active layer and clad layers; and a current diffusion layer formed above a GaP substrate, wherein the current diffusion layer is defined as $In_xAl_yGa_{1-x-y}P$ (0<x<1, 0<y<1) where a composition ratio of In equals to x and a composition ratio of Al equals to y.

According to the above structure, the $In_xAl_yGa_{1-x-y}P$ current diffusion layer formed on top of the layers has the In composition ratio x equal to (0<X<1). Consequently, the uneven depth of the crystal surface is considerably diminished, and the crystal defect concentration is substantially decreased. As a result, a current diffusion layer with good crystallinity can be obtained. In the case where the band gap is decreased by increasing the value of the In composition ratio x for improving the crystallinity, the band gap of the current diffusion layer can be increased without degrading the crystallinity by the step of increasing the value of the Al composition ratio y. Accordingly, when the active layer is made up of an AlGaInP based semiconductor, the light emitted in the active layer is not absorbed in the current diffusion layer, which implements substantial improvement of light emitting efficiency. Further, the light emitting device can be produced simply by forming each layer in sequence on the GaP substrate, which contributes to reduction of the production costs.

In one embodiment of the present invention, a normal of the GaP substrate surface inclines with respect to a normal of a (100) plane toward a [011] direction.

According to the above structure, the normal of the GaP substrate surface inclines with respect to the normal of the (100) plane toward the [011] direction, so that during film creation, there appears on the crystal surface a (111) plane in which V group atoms are migrating. Therefore, it becomes difficult for VI group oxygen to mix with crystals in the current diffusion layer, which decreases the resistivity and lowers the drive voltage. Further, there appears on the crystal surface a (111) plane which is easily crystallized, so that the evenness of the current diffusion layer is increased and the crystal defects are decreased.

In one embodiment of the present invention, the normal of the GaP substrate surface inclines with respect to the normal of the (100) plane toward the [011] direction by a range from 2 to 20 degrees.

The above structure brings about the most significant decrease of the resistivity and improvement of the evenness of the current diffusion layer.

In one embodiment of the present invention, the current diffusion layer is larger in an energy gap than the active layer.

According to the above structure, the current diffusion layer is larger in an energy gap than the active layer, so that in the case where the active layer is made up of an AlGaInP based semiconductor, the light emitted in the active layer is absorbed neither in the GaP substrate nor in the current diffusion layer, which implements considerable increase of light emitting efficiency.

In one embodiment of the present invention, the light emitting portions are defined as $In_xAl_yGa_{1-x-y}P$ ($0 \leq x \leq 1$, $0 \leq y \leq 1$) where a composition ratio of In equals to x, and a composition ratio of Al equals to y.

According to the above structure, the light emitted from the light emitting portions having the emission wavelength ranging from 550 nm to 680 nm is absorbed neither in the GaP substrate nor in the current diffusion layer, which implements considerable increase of light emitting efficiency.

In one embodiment of the present invention, the light emitting portions are defined as $Al_xGa_{1-x}As$ ($0 \leq x \leq 1$) where a composition ratio of Al equals to x.

According to the above structure, the light emitted from the light emitting portions having the emission wavelength ranging from 700 nm to 880 nm is absorbed neither in the GaP substrate nor in the current diffusion layer, which implements considerable increase of light emitting efficiency.

In one embodiment of the present invention, the light emitting portions are defined as $In_xAl_yGa_{1-x-y}As$ ($0 \leq x \leq 1$, $0 \leq y \leq 1$) where a composition ratio of In equals to x, and a composition ratio of Al equals to y.

According to the above structure, the light emitted from the light emitting portions having the emission wavelength ranging from 700 nm to 1500 nm is absorbed neither in the GaP substrate nor in the current diffusion layer, which implements considerable increase of light emitting efficiency.

In one embodiment of the present invention, the light emitting portions are defined as $In_xGa_{1-x}As_yP_{1-y}$ ($0 \leq x \leq 1$, $0 \leq y \leq 1$) where a composition ratio of In equals to x, and a composition ratio of As equals to y.

According to the above structure, the light emitted from the light emitting portions having the emission wavelength ranging from 900 nm to 1700 nm is absorbed neither in the GaP substrate nor in the current diffusion layer, which implements considerable increase of light emitting efficiency.

In one embodiment of the present invention, the light emitting portions are defined as $Al_xGa_{1-x}As_ySb_{1-y}$ ($0 \leq x \leq 1$, $0 \leq y \leq 1$) where a composition ratio of Al equals to x, and a composition ratio of As equals to y.

According to the above structure, the light emitted from the light emitting portions having the emission wavelength ranging from 850 nm to 1700 nm is absorbed neither in the GaP substrate nor in the current diffusion layer, which implements considerable increase of light emitting efficiency.

In one embodiment of the present invention, the light emitting portions are defined as $In_xAl_yGa_{1-x-y}N$ ($0 \leq x \leq 1$, $0 \leq y \leq 1$) where a composition ratio of In equals to x, and a composition ratio of Al equals to y.

According to the above structure, the light emitted from the light emitting portions having the emission wavelength ranging from 500 nm to 600 nm is absorbed neither in the GaP substrate nor in the current diffusion layer, which implements considerable increase of light emitting efficiency.

In one embodiment of the present invention, a current interruption layer is provided in between the light emitting portions and a current diffusion layer.

According to the above structure, the current interruption layer provided in between the light emitting portions and the current diffusion layer controls a current route inside the current diffusion layer.

In one embodiment of the present invention, the current interruption layer is larger in an energy gap than the active layer.

According to the above structure, the current interruption layer is larger in an energy gap than the active layer, so that in the case where the active layer is made up of an AlGaInP based semiconductor, the light emitted in the active layer is absorbed neither in the GaP substrate nor in the current interruption layer, which implements considerable increase of light emitting efficiency.

In one embodiment of the present invention, the current interruption layer is disposed in a center of an interface between the light emitting portions and the current diffusion layer.

According to the above structure, the current interruption layer is disposed in the center of the interface between the light emitting portions and the current diffusion layer. Therefore, inside the current diffusion layer, the current route is outspread to the periphery, as a consequence of which light emission is performed in the wide range of the active layer, resulting in considerable increase of light emitting efficiency.

In one embodiment of the present invention, the current interruption layer is disposed in a periphery of an interface between a light emitting portion and a current diffusion layer.

According to the above structure, the current interruption layer is provided in the periphery of an interface between the light emitting portion and the current diffusion layer. Therefore, inside the current diffusion layer, the current route is concentrated in the central section, which contributes to considerable improvement of light emitting directivity.

In one embodiment of the present invention, the current interruption layer is made up of a GaP.

According to the above structure, GaP is used as the current interruption layer, so that in the case where the active layer is made up of an AlGaInP based semiconductor, the light emitted in the active layer is absorbed neither in the GaP substrate nor in the current interruption layer, which implements considerable increase of light emitting efficiency.

In one embodiment of the present invention, the current interruption layer is defined as $In_xGa_{1-x}P$ (0<X<1) where a composition ratio of In equals to x.

According to the above structure, InGaP is used as the current interruption layer, so that in the case where the active layer is made up of an AlGaInP based semiconductor, the light emitted in the active layer is absorbed neither in the GaP substrate nor in the current interruption layer, which implements considerable increase of light emitting efficiency.

In one embodiment of the present invention, the current interruption layer is defined as $In_xAl_yGa_{1-x-y}P$ ($0 \leq x \leq 1$, $0 \leq y \leq 1$) where a composition ratio of In equals to x and a composition ratio of Al equals to y.

According to the above structure, InAlGaP is used as the current interruption layer, so that in the case where the active layer is made up of an AlGaInP based semiconductor, the light emitted in the active layer is absorbed neither in the GaP substrate nor in the current interruption layer, which implements considerable increase of light emitting efficiency.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinafter, the embodiments of the present invention will be described in detail with reference to accompanied drawings.

(First Embodiment)

Figure 1:
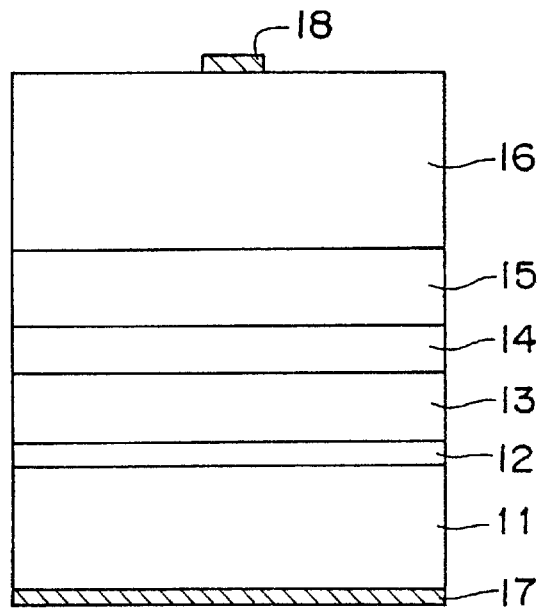
FIG. 1 is a cross sectional view showing an AlGaInP-based compound semiconductor light emitting device as the semiconductor light emitting device of the present invention.

FIG. 1 is a cross sectional view showing an AlGaInP-based compound semiconductor light emitting device as a semiconductor light emitting device in this embodiment. Hereinbelow, description will be made of the AlGaInP-based compound semiconductor light emitting device in this embodiment with reference to FIG. 1.

First, on an n-GaP substrate 11, there are created in sequence in a laminated state: an $n-In_xAl_yGa_{1-x-y}P$ (0<x<1, 0<y<1) lattice distortion relaxation layer 12 (e.g. x=0.3, y=0.4, Si density of $5 \times 10^{17}$ cm$^{-3}$) with the film thickness of 1 μm; an $n-In_xAl_yGa_{1-x-y}P$ (0<x<1, 0<y<1) clad layer 13 (e.g. x=0.5, y=0.5, Si density of $5 \times 10^{17}$ cm$^{-3}$) with the film thickness of 1 μm; an $In_xAl_yGa_{1-x-y}P$ ($0 \leq x \leq 1$, $0 \leq y \leq 1$) active layer 14 (e.g. x=0.5, y=0.15) with the film thickness of 0.5 μm; a $p-In_xAl_yGa_{1-x-y}P$ ($0 \leq x \leq 1$, $0 \leq y \leq 1$) clad layer 15 (e.g. x=0.5, y=0.5, Zn density of $5 \times 10^{17}$ cm$^{-3}$) with the film thickness of 1.0 μm; and a $p-In_xGa_{1-x}P$ (0<X<1) current diffusion layer 16 (e.g. x=0.01, Zn density of $5 \times 10^{18}$ cm$^{-3}$) with the thickness of 5 μm. Next, an electrode 17 is formed below the n-GaP substrate 11, and an electrode 18 is formed above the current diffusion layer 16. Through the steps stated above, an AlGaInP-based compound light-emitting device is completed.

Figure 2:
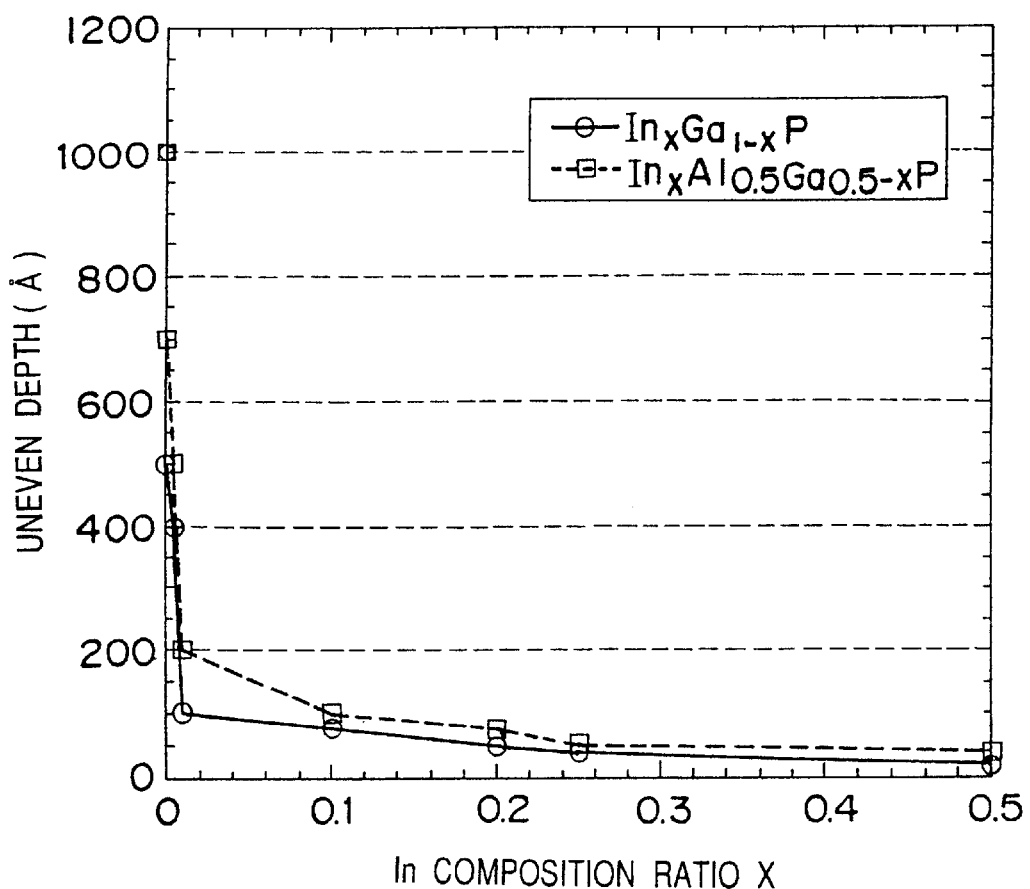
FIG. 2 is a view showing the relation between In composition ratio x in an $In_xGa_{1-x}P$ layer and an $In_xAl_yGa_{1-x-y}P$ layer and the uneven depth of the crystal surface.

In this embodiment, a $p-In_xGa_{1-x}P$ layer (x=0.01) is used as the current diffusion layer 16. FIG. 2 refers to the relation of In composition ratio x in an $In_xGa_{1-x}P$ layer (0<x<0.5) and an $In_xAl_yGa_{1-x-y}P$ (0<x<0.5, y=0.5) layer to the uneven depth of the crystal surface. As shown in FIG. 2, in the GaP layer and the $Al_{0.5}Ga_{0.5}P$ layer with In composition ratio x=0, the uneven depth on the crystal surface is as high as 1000 Å. Contrary to this, if In composition ratio x is not equal to 0 and an In content is present though how small, the uneven depth on the crystal surface is considerably decreased. In the level of In composition ratio x=0.01, the uneven depth is decreased to 200 Å or lower. Therefore, the uneven depth of the crystal surface can be decreased to 200 Å or lower by creating the current diffusion layer 16 which constitutes the uppermost layer of the AlGaInP-based compound light-emitting device, with the $p-In_xGa_{1-x}P$ layer where In composition ratio x equals to 0.01.

Figure 3:
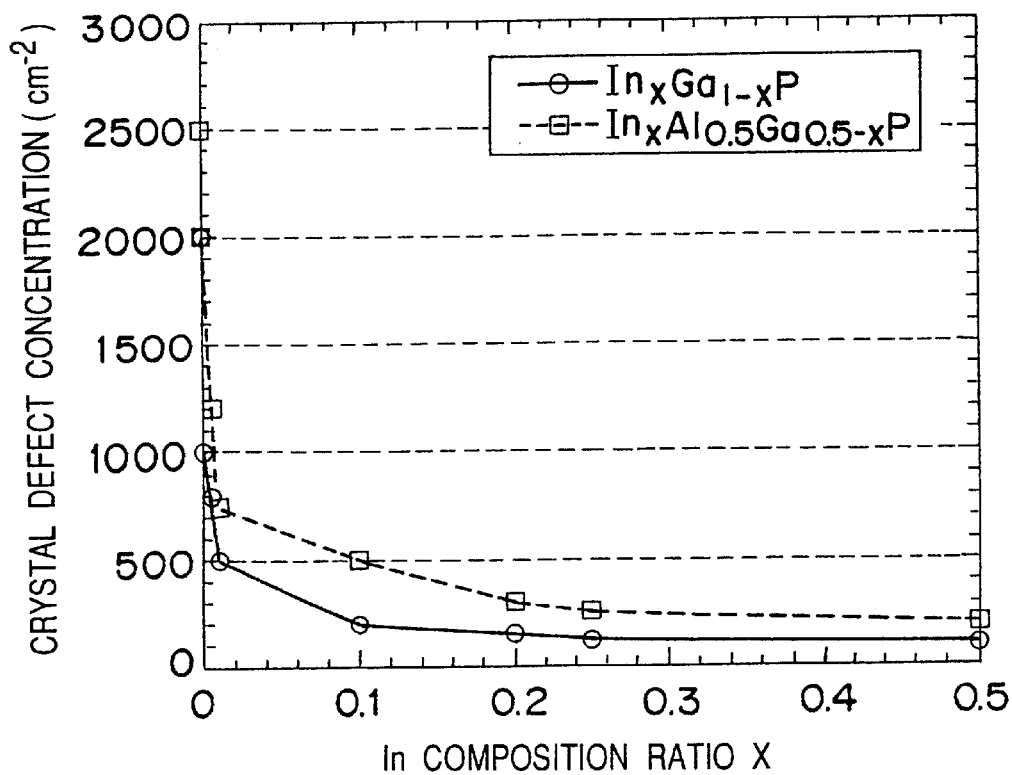
FIG. 3 is a view showing the relation between In composition ratio x in an $In_xGa_{1-x}P$ layer and an $In_xAl_yGa_{1-x-y}P$ layer and the crystal defect concentration.

FIG. 3 refers to the relation of In composition ratio X in an $In_xGa_{1-x}P$ layer (0<x<0.5) and an $In_xAl_yGa_{1-x-y}P$ (0<x<0.5, y=0.5) layer to the crystal defect concentration. As shown in FIG. 3, in the GaP layer and the $Al_{0.5}Ga_{0.5}P$ layer with In composition ratio x=0, the crystal defect concentration is extremely high. Contrary to this, if In composition ratio x is not equal to 0 and an In content is present though how small, the crystal defect concentration is remarkably decreased. In the level of In composition ratio x=0.01, the concentration is decreased to 500 defects/cm$^2$ or lower. Therefore, the crystal defect concentration can be decreased to 500 defects/cm$^2$ or lower by creating the current diffusion layer 16 which constitues the uppermost layer of the AlGaInP-based compound light-emitting device, with the $p-In_xGa_{1-x}P$ layer where In composition ratio x equals to 0.01.

The above-stated effect is obtained by the following two reasons. The GaP layer has large energy to bond Ga atoms and P atoms in its crystal, so that it is difficult to achieve migration of Ga atoms across the growing crystal surface, which brings about not a good layer growth but an insular growth of the crystal. Therefore, it can be said that the GaP layer has a factor to facilitate generation of crystal defects. On the other hand, In atoms have small energy to bond with P atoms, so that it is easy to achieve migration of In atoms across the growing crystal surface, which brings about a good layer growth of the crystal. As a result, the uneven depth on the crystal surface is remarkably decreased and the evenness is improved, while at the same time, the crystal defect concentration is considerably decreased.

Further in this embodiment, with the $In_xAl_yGa_{1-x-y}P$ (x=0.5, y=0.15) active layer 14 (Eg=1.9 eV), $p-In_xGa_{1-x}P$ (x=0.01) (Eg=2.26 eV) is used as the current diffusion layer 16. Consequently, the $p-In_xGa_{1-x-y}P$ current diffusion layer 16 is larger in the band gap than the active layer 14, so that the light emitted in the $In_xAl_yGa_{1-x-y}P$ ($0 \leq x \leq 1$, $0 \leq y \leq 1$) active layer 14 having the emission wavelength ranging from 550 nm to 680 nm is extracted without being absorbed by the n-GaP substrate 11 nor by the current diffusion layer 16 transparent against a radiation light of an InAlGaP based semiconductor element.

In this embodiment as stated above, on the n-GaP substrate 11 transparent against a radiation light of an InAlGaP based semiconductor element, there are formed a lattice distortion relaxation layer 12 and a clad layer 13 composed of $In_xAl_yGa_{1-x-y}P$ (0<x<1, 0<y<1), and thereafter formed an $In_xAl_yGa_{1-x-y}P$ ($0 \leq x \leq 1$, $0 \leq y \leq 1$) active layer 14. Then, there are further formed an $In_xAl_yGa_{1-x-y}P$ ($0 \leq x \leq 1$, $0 \leq y \leq 1$) clad layer 15, and an $In_xGa_{1-x}P$ (0<X<1) current diffusion layer 16. Consequently, the uppermost layer is composed of the $In_xGa_{1-x}P$ current diffusion layer 16 where In composition ratio x equals to (0<X<1). As a result, the uneven depth on the crystal surface is decreased and the crystal defect concentration is lowered.

Further, it is possible to make the energy gap of the $In_xGa_{1-x}P$ (0<X<1) current diffusion layer 16 (Eg=2.26 eV) larger than that of the active layer 14 (Eg=1.9 eV) by setting the In composition ratio x of the current diffusion layer 16 equal to "0.01". Consequently, the lowermost layer n-GaP substrate 11 and the uppermost p-InGaP current diffusion layer 16 are made transparent against the radiation light from the InAlGaP active layer 14, by which light emitting efficiency is increased.

In addition, an AlGaInP-based compound light-emitting device in this embodiment can be obtained simply by forming a lattice distortion relaxation layer 12 to a current diffusion layer 16 in sequence on the n-GaP substrate 11 by the MOCVD method or the like. Therefore, compared to the prior art AlGaInP based semiconductor light emitting device created by the steps shown in FIG. 10, the AlGaInP-based compound light-emitting device in this embodiment can implement reduction of the production costs.

Hereinafter, description will be given of the present invention in comparison to an AlGaInP-based compound semiconductor light emitting device having a structure of FIG. 1, formed not on the n-GaP substrate but on a GaAs substrate as stated below.

First, on an n-GaAs substrate there are created in sequence in a laminated state an $n-In_xAl_yGa_{1-x-y}P$ (0<x<1, 0<y<1) buffer layer (e.g. x=0.3, y=0.4, Si density of $5 \times 10^{17}$ $cm^{-3}$) with the film thickness of 1.0 μm; an $In_xAl_yGa_{1-x-y}P$ (0<x<1, 0<y<1) clad layer (e.g. x=0.5, y=0.5, Si density of $5 \times 10^{17}$ $cm^{-3}$) with the film thickness of 1 μm; an $In_xAl_yGa_{1-x-y}P$ ($0 \leq x \leq 1$, $0 \leq y \leq 1$) active layer (e.g. x=0.5, y=0.2) with the film thickness of 0.5 μm; a $p-In_xAl_yGa_{1-x-y}P$ ($0 \leq x \leq 1$, $0 \leq y \leq 1$) clad layer (e.g. x=0.5, y=0.5, Zn density of $5 \times 10^{17}$ $cm^{-3}$) with the film thickness of 1.0 μm; and a $p-In_xGa_{1-x}P$ (0<X<1) current diffusion layer (e.g. x=0.01, Zn density of $5 \times 10^{18}$ $cm^{-3}$) with the film thickness of 5 μm. Next, an electrode is formed below the n-GaAs substrate, and another electrode is formed above the current diffusion layer.

In the case where the AlGaInP-based compound semiconductor light emitting device is formed on the n-GaAs substrate as stated above, the active layer and the clad layer have lattice-matching with the n-GaAs substrate. Consequently, the $p-In_xGa_{1-x}P$ (0<X<1) current diffusion layer created thereon shows relatively good crystallinity. However, the light emitted in the active layer is absorbed by the n-GaAs substrate which acts as a photoabsorption layer against a radiation light of an AlGaInP based semiconductor element. As a result, light emitting intensity is considerably decreased.

In an AlGaInP-based compound semiconductor light emitting device of the present invention, other materials were used as the active layer as an $Al_xGa_{1-x}As$ layer ($0 \leq x \leq 1$) (light emitting wavelength of 700 nm to 880 nm); an $In_xAl_yGa_{1-x-y}As$ layer ($0 \leq x \leq 1$, $0 \leq y \leq 1$) (light emitting wavelength of 700 nm to 1500 nm); an $In_xGa_{1-x}As_yP_{1-y}$ layer ($0 \leq x \leq 1$, $0 \leq y \leq 1$) (light emitting wavelength of 900 nm to 1700 nm); an $Al_xGa_{1-x}As_ySb_{1-y}$ layer ($0 \leq x \leq 1$, $0 \leq y \leq 1$) (light emitting wavelength of 850 nm to 1700 nm); and an $In_xAl_yGa_{1-x-y}N$ layer ($0 \leq x \leq 1$, $0 \leq y \leq 1$) (light emitting wavelength of 500 nm to 600 nm). In either case, the light emitted in the active layer was not absorbed by the GaP substrate nor by the $In_xGa_{1-x}P$ current diffusion layer, so that sufficient effects were verified.

It is noted that in this embodiment even if the composition ratios x and y are properly changed in all the layers, sufficient effects can be obtained which include considerable reduction of the uneven depth on the crystal surface, substantial decrease of the crystal defect concentration, and high light emitting efficiency with transparency against a radiation light from the active layer. It goes without saying that these effects are obtainable regardless of structural differences such as the form of electrodes 17 and 18, the presence and the form of a current interruption layer described after, and the formation of a quantum well for the active layer 14.

(Second Embodiment)

Figure 4:
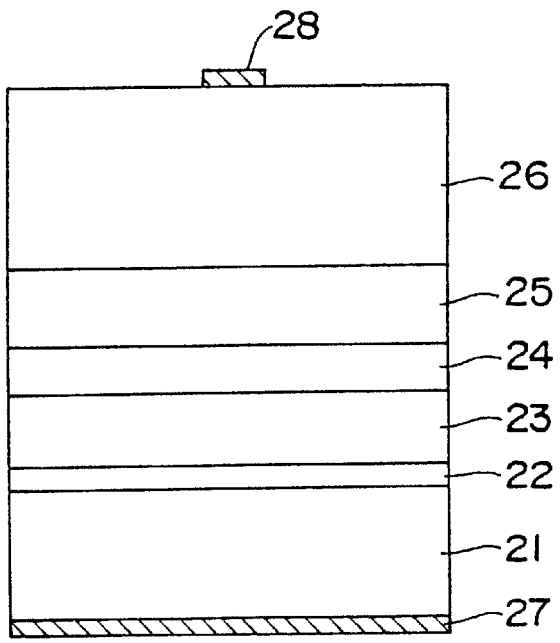
FIG. 4 is a cross sectional view showing an AlGaInP-based compound semiconductor light emitting device different from that of FIG. 1.

FIG. 4 is a cross sectional view showing an AlGaInP-based compound semiconductor light emitting device as a semiconductor light emitting device of this embodiment. Hereinbelow, description will be made of the AlGaInP-based compound semiconductor light emitting device in this embodiment with reference to FIG. 4. This embodiment is identical to the first embodiment except the point that the current diffusion layer uses an $In_xAl_yGa_{1-x-y}P$ (0<x<1, 0<y<).

First, on an n-GaP substrate 21, there are created in sequence in a laminated state an n-AlGaInP lattice distortion relaxation layer 22 (e.g. Si density of $5 \times 10^{17}$ $cm^{-3}$) with the film thickness of 0.5 μm; an $n-In_xAl_yGa_{1-x-y}P$ ($0 \leq x \leq 1$, $0 \leq y \leq 1$) clad layer 23 (e.g. x=1.0, y=0.5, Si density of $5 \times 10^{17}$ $cm^{-3}$) with the film thickness of 1 μm; an $In_xAl_yGa_{1-x-y}P$ ($0 \leq x \leq 1$, $0 \leq y \leq 1$) active layer 24 (e.g. x=0.5, y=0.4) with the film thickness of 0.5 μm; a $p-In_xAl_yGa_{1-x-y}P$ ($0 \leq x \leq 1$, $0 \leq y \leq 1$) active layer 25 (e.g. x=0.5, y=0.5, Zn density of $5 \times 10^{17}$ $cm^{-3}$) with the film thickness of 1.0 μm; and a $p-In_xAl_yGa_{1-x-y}P$ (0<x<1, 0<y<1) current diffusion layer 26 (e.g. x=0.2, y=0.2) with the thickness of 5 μm. Next, an electrode 27 is formed below the n-GaP substrate 21, and an electrode 28 is formed above the current diffusion layer 26. Through the steps stated above, an AlGaInP-based compound light-emitting device is completed.

In this embodiment, a p-In$_x$Al$_y$Ga$_{1-x-y}$P (x=0.2, y=0.2) is used as the current diffusion layer 26. As shown in FIGS. 2 and 3, as In composition x of the p-In$_x$Al$_y$Ga$_{1-x-y}$P current diffusion layer 26 is increased, the uneven depth on the crystal surface and the crystal defect concentration are decreased. On the other hand, the band gap is also decreased. However, as is clear from FIGS. 2 and 3, the relation of In composition ratio x in the p-In$_x$Al$_y$Ga$_{1-x-y}$P layer to the uneven depth on the crystal surface and the crystal defect concentration is independent from Al composition ratio y.

Accordingly, in this embodiment, the Al composition ratio y of the p-In$_x$Al$_y$Ga$_{1-x-y}$P current diffusion layer 26 is increased, by which the band gap of the current diffusion layer 26 (Eg=2.3 eV) is made larger than the band gap of the In$_x$Al$_y$Ga$_{1-x-y}$P (x=0.5, y=0.2) active layer 24 (Eg=2.0 eV) without changing the uneven depth on the crystal surface and the crystal defect concentration. As a result, the light emitted in the active layer 24 can be extracted without being absorbed by the GaP substrate 21 or by the current diffusion layer 26 either.

(Third Embodiment)

Figure 5:
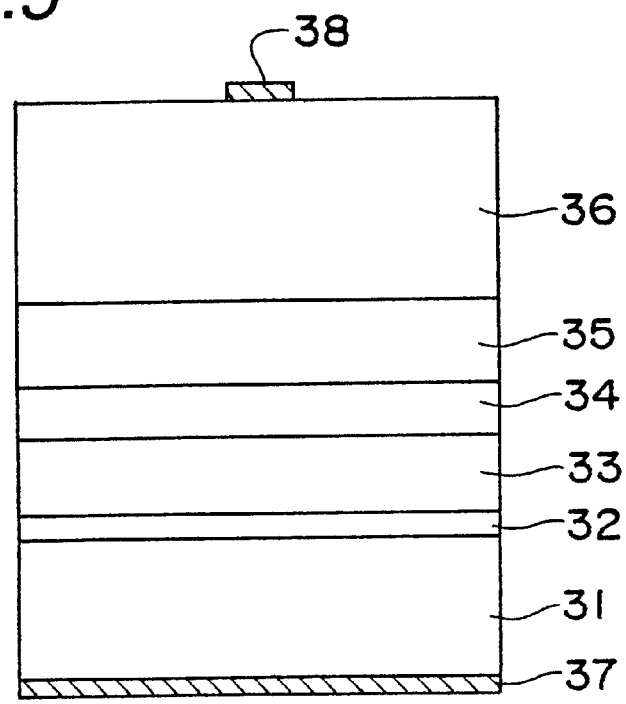
FIG. 5 is a cross sectional view showing an AlGaInP-based compound semiconductor light emitting device different from that of FIGS. 1 and 4.

FIG. 5 is a cross sectional view showing an AlGaInP-based compound semiconductor light emitting device as a semiconductor light emitting device of this embodiment. Hereinbelow, description will be made of the AlGaInP-based compound semiconductor light emitting device in this embodiment with reference to FIG. 5. This embodiment is identical to the first embodiment except the point that the In$_x$Al$_y$Ga$_{1-x-y}$P current diffusion layer is different in values of the composition ratio x and y.

First, on an n-GaP substrate 31, there are created in sequence in a laminated state an n-AlGaInP lattice distortion relaxation layer 32 (e.g. Si density of 5×10$^{17}$ cm$^{-3}$) with the film thickness of 0.5 μm; an n-In$_x$Al$_y$Ga$_{1-x-y}$P (0≦x≦1, 0≦y≦1) clad layer 33 (e.g. x=0.5, y=0.5, Si density of 5×10$^{17}$ cm$^{-3}$) with the film thickness of 1.0 μm; an In$_x$Al$_y$Ga$_{1-x-y}$P (0≦x≦1, 0≦y≦1) active layer 34 (e.g. x=0.5, y=0.15) with the film thickness of 0.5 μm; a p-In$_x$Al$_y$Ga$_{1-x-y}$P (0≦x≦1, 0≦y≦1) clad layer 35 (e.g. x=0.5, y=0.5, Zn density of 5×10$^{17}$ cm$^{-3}$) with the film thickness of 1.0 μm; and a p-In$_x$Al$_y$Ga$_{1-x-y}$P (0<x<1, 0<y<1) current diffusion layer 36 (e.g. x=0.2, y=0.5) with the film thickness of 5 μm. Next, an electrode 37 is formed below the n-GaP substrate 31, and an electrode 38 is formed above the current diffusion layer 36. Through the steps stated above, an AlGaInP-based compound light-emitting device is completed.

In this embodiment, a p-In$_x$Al$_y$Ga$_{1-x-y}$P (x=0.2, y=0.5) is used as the current diffusion layer 36. As shown in FIGS. 2 and 3, as In composition x of the p-In$_x$Al$_y$Ga$_{1-x-y}$P current diffusion layer 36 is increased, the uneven depth on the crystal surface and the crystal defect concentration are decreased because the relation of In composition ratio x in the p-In$_x$Al$_y$Ga$_{1-x-y}$P layer to the uneven depth on the crystal surface and the crystal defect concentration is independent from Al composition ratio y. On the other hand, however, the band gap is decreased. Accordingly, the band gap of the current diffusion layer 36 is smaller than the band gap of the In$_x$Al$_y$Ga$_{1-x-y}$P (x=0.5, y=0.15) active layer 34 (Eg=1.9 eV), which causes absorption of light in the current diffusion layer 36.

Therefore, in this embodiment, the Al composition ratio y is increased to 0.5, by which the band gap of the current diffusion layer 36 (Eg=2.0 eV) is made larger than the band gap of the active layer 34. As a result, the light emitted in the active layer 34 can be extracted without being absorbed by the GaP substrate 31 nor the current diffusion layer 36 either.

(Fourth Embodiment)

Figure 6:
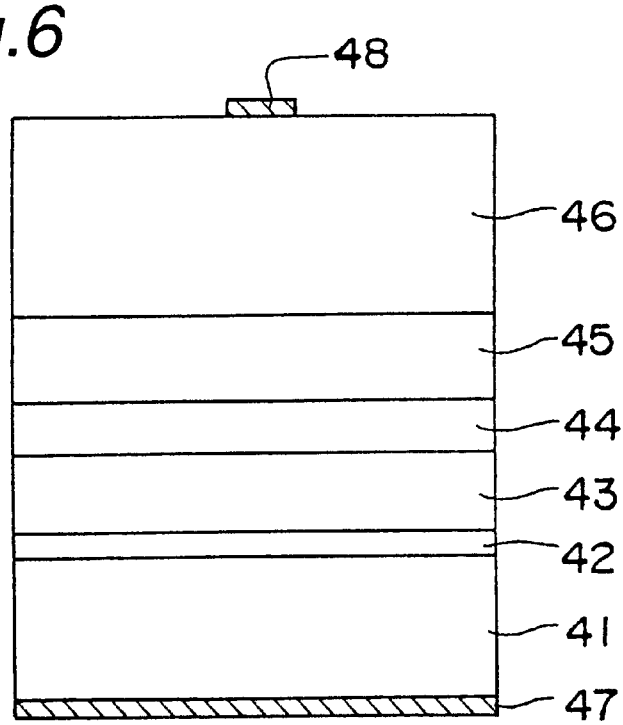
FIG. 6 is a cross sectional view showing an AlGaInP-based compound semiconductor light emitting device different from that of FIGS. 1, 4, and 5.

FIG. 6 is a cross sectional view showing an AlGaInP-based compound semiconductor light emitting device as a semiconductor light emitting device of this embodiment. Hereinbelow, description will be made of the AlGaInP-based compound semiconductor light emitting device in this embodiment with reference to FIG. 6. This embodiment is identical to the third embodiment except the point that the normal of the n-GaP substrate surface inclines with respect to the normal of the (100) plane toward the [011] direction.

First, on an n-GaP substrate 41 whose surface has a normal inclining with respect to the normal of the (100) plane toward the [011] direction by 15 degrees, there are created in sequence in a laminated state an n-AlGaInP lattice distortion relaxation layer 42 (e.g. Si density of 5×10$^{17}$ cm$^{-3}$) with the film thickness of 0.5 μm; an n-In$_x$Al$_y$Ga$_{1-x-y}$P (0≦x≦1, 0≦y≦1) clad layer 43 (e.g. x=0.5, y=0.5, Si density of 5×10$^{17}$ cm$^{-3}$) with the film thickness of 1.0 μm; an In$_x$Al$_y$Ga$_{1-x-y}$P (0≦x≦1, 0≦y≦1) active layer 44 (e.g. x=0.5, y=0.2) with the film thickness of 0.5 μm; a p-In$_x$Al$_y$Ga$_{1-x-y}$P (0≦x≦1, 0≦y≦1) clad layer 45 (e.g. x=0.5, y=0.5, Zn density of 5×10$^{17}$ cm$^{-3}$) with the film thickness of 1.0 μm; and a p-In$_x$Al$_y$Ga$_{1-x-y}$P (0<x<1, 0<y<1) current diffusion layer 46 (e.g. x=0.5, y=0.5, Zn density of 5×10$^{18}$ cm$^{-3}$) with the thickness of 5 μm. Next, an electrode 47 is formed below the n-GaP substrate 41, and an electrode 48 is formed above the current diffusion layer 46. Through the steps stated above, an AlGaInP-based compound light-emitting device is completed.

In this embodiment, a p-In$_x$Al$_y$Ga$_{1-x-y}$P (x=0.5, y=0.5) is used as the current diffusion layer 46 the third embodiment. Here, the normal of the n-GaP substrate 41 surface inclines with respect to the normal of the (100) plane toward the (011) direction, so that the resistance of the current diffusion layer 46 is reduced, which enables decrease of drive voltage.

Figure 7A:
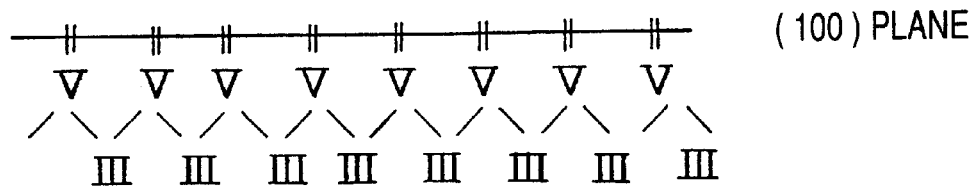
FIGS. 7A and 7B are model views expressing the crystal surface of a III-V group.
Figure 7B:
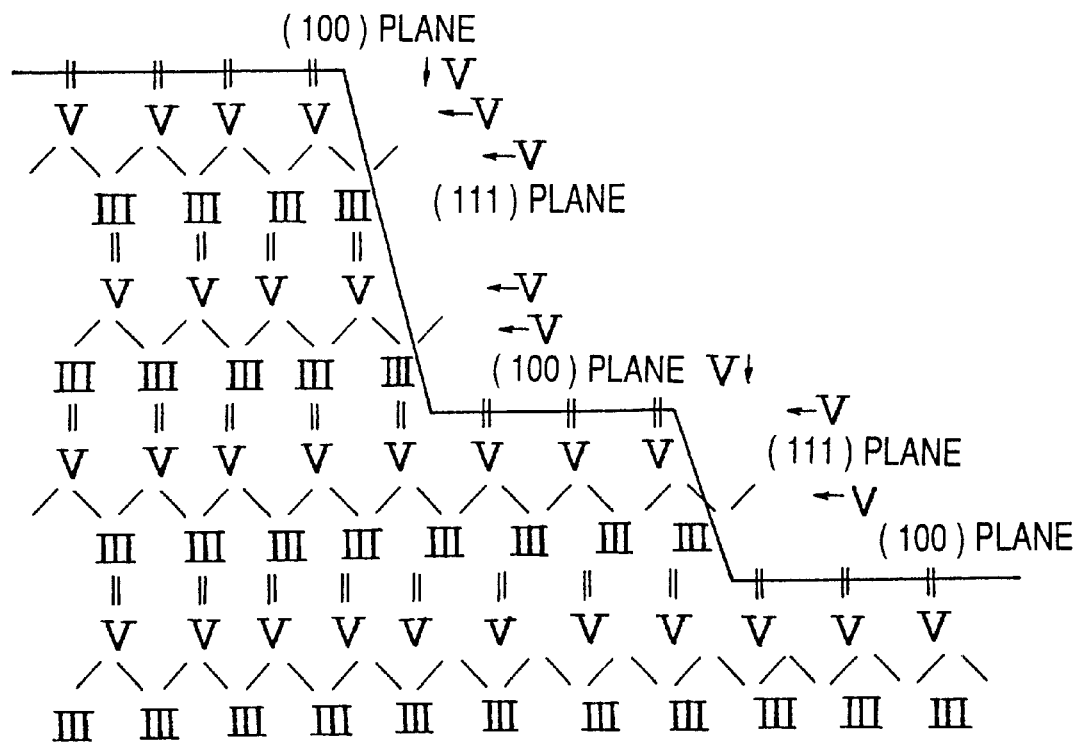

The reason for the above-stated effect will be described hereinbelow with reference to FIGS. 7A and 7B. FIGS. 7A and 7B are model views showing the crystal surface of a III-V group. As shown in FIG. 7A, double-bonded V group atoms are present on the surface of the (100) plane. As shown in FIG. 7B, however, with inclination toward the [011] direction, there appears in the form of steps a (111) plane, that is a crystal surface having single-bonded III group atoms. The (111) plane is covered with single-bonded III group atoms, so that in the process of film creation, V group atoms (P atoms in the case of this embodiment) are supplied and bonded with III group atoms in the (111) plane. However, since these bonding are single bonding, the bonding strength thereof is weak and therefore the bonds are easily relieved, resulting in migration of V group atoms on the surface.

On the other hand, one of the reasons for high resistivity of the p-In$_x$Al$_y$Ga$_{1-x-y}$P layer resides in mixture of O (oxygen). O (oxygen) is a VI group element and therefore it is easily fitted into a lattice position of a V group site. However, in this embodiment, V group atoms are migrating on the crystal surface because of the above-stated reason, so that a number of V group atoms are present on the crystal surface, which hinders O (oxygen) from going into a lattice position of a V group site. As a result, the resistivity of the current diffusion layer 46 is decreased.

Further, the normal of the n-GaP substrate 41 surface inclines with respect to the normal of the (100) plane toward the [011] direction, so that a (111) plane appears on the crystal surface like steps. This means that a good crystal surface which can easily achive layer growth is formed per step, which implements remarkable reduction of the uneven depth of the crystal surface and improvement of the evenness.

It is noted that in this embodiment, an angle of the normal of the n-GaP substrate 41 surface inclines with respect to the normal of the (100) plane toward the [011] direction is set to be "15 degrees". However, it will be understood that the inclination angle in the present invention is not limited to the angle stated above, so that the same effect is achievable if the angle is within the range from 2 degrees to 20 degrees.

Further, in this embodiment, inclination of the normal of the n-GaP substrate surface is applied to the third embodiment in which $In_xAl_yGa_{1-x-y}P$ is used as a current diffusion layer. However, it will be understood that the inclination is also applicable to the first embodiment in which $In_xGa_{1-x}P$ is used as a current diffusion layer.

(Fifth Embodiment)

Figure 8:
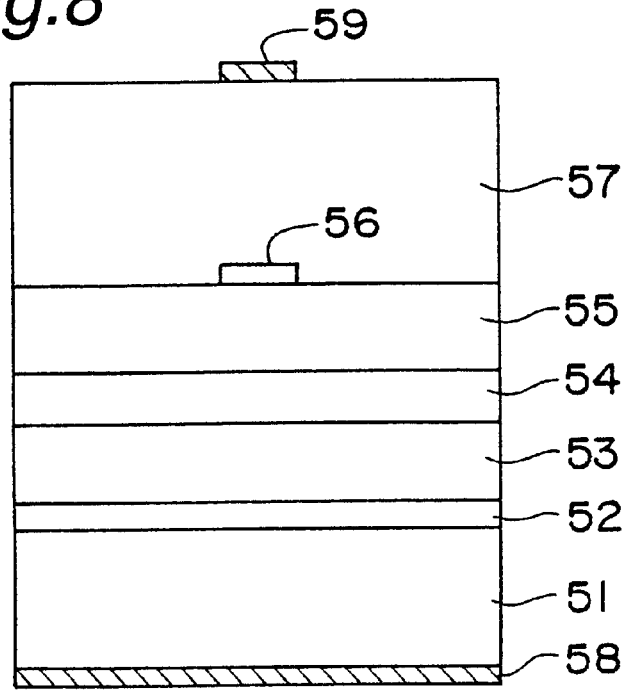
FIG. 8 is a cross sectional view showing an AlGaInP-based compound semiconductor light emitting device different from that of FIGS. 1, and 4 through 6.

FIG. 8 is a cross sectional view showing an AlGaInP-based compound semiconductor light emitting device as a semiconductor light emitting device of this embodiment. Hereinbelow, description will be made of the AlGaInP-based compound semiconductor light emitting device in this embodiment with reference to FIG. 8. This embodiment is identical to the third embodiment except the point that a current interruption layer is provided in the central portion in between the clad layer and the current diffusion layer.

First, on an n-GaP substrate 51, there are created in sequence in a laminated state an n-AlGaInP lattice distortion relaxation layer 52 (e.g. Si density of $5 \times 10^{17}$ cm$^{-3}$) with the film thickness of 0.5 μm; an n-$In_xAl_yGa_{1-x-y}P$ ($0 \leq x \leq 1$, $0 \leq y \leq 1$) clad layer 53 (e.g. x=0.5, y=0.5, Si density of $5 \times 10^{17}$ cm$^{-3}$) with the film thickness of 1.0 μm; an $In_xAl_yGa_{1-x-y}P$ ($0 \leq x \leq 1$, $0 \leq y \leq 1$) active layer 54 (e.g. x=0.38, y=0.2) with the film thickness of 0.5 μm; a p-$In_xAl_yGa_{1-x-y}P$ ($0 \leq x \leq 1$, $0 \leq y \leq 1$) clad layer 55 (e.g. x=0.5, y=0.5, Zn density of $5 \times 10^{17}$ cm$^{-3}$) with the film thickness of 1.0 μm; an n-$In_xAl_yGa_{1-x-y}P$ ($0<x<1$, $0 \leq y \leq 1$) current interruption layer 56 (e.g. x=0.20, y=0.20, Si density of $5 \times 10^{17}$ cm$^{-3}$) with the film thickness of 0.5 μm; and a p-$In_xAl_yGa_{1-x-y}P$ ($0<x<1$, $0 \leq y \leq 1$) current diffusion layer 57 (e.g. x=0.2, y=0.2, Zn density of $5 \times 10^{18}$ cm$^{-3}$) with the film thickness of 5 μm. Next, an electrode 58 is formed below the n-GaP substrate 51, and an electrode 59 is formed above the current diffusion layer 57. Through the steps stated above, an AlGaInP-based compound light-emitting device is completed.

The $In_xAl_yGa_{1-x-y}P$ current interruption layer 56 is disposed in the central portion of the interface between the clad layer 55 and the current diffusion layer 57. The electrode 59 on the current diffusion layer 57 is disposed in the central portion of the upper surface of the current diffusion layer 57 so as to be overlapped with the current interruption layer 56.

As shown in the above description, in this embodiment, the current interruption layer 56 is provided in the central portion in between the clad layer 55 and the current diffusion layer 57. Accordingly, with the effect of the current interruption layer 56, current supplied from the electrode 59 is further diffused widely inside the current diffusion layer 57. As a result, light emission is performed in the wide range of the active layer 54, by which light extraction efficiency is further increased.

Although $In_xAl_yGa_{1-x-y}P$ is used as the current interruption layer 56 in the above-stated embodiment, it will be understood that the same effect can be implemented by using GaP or $In_xGa_{1-x}P$.

(Sixth Embodiment)

Figure 9:
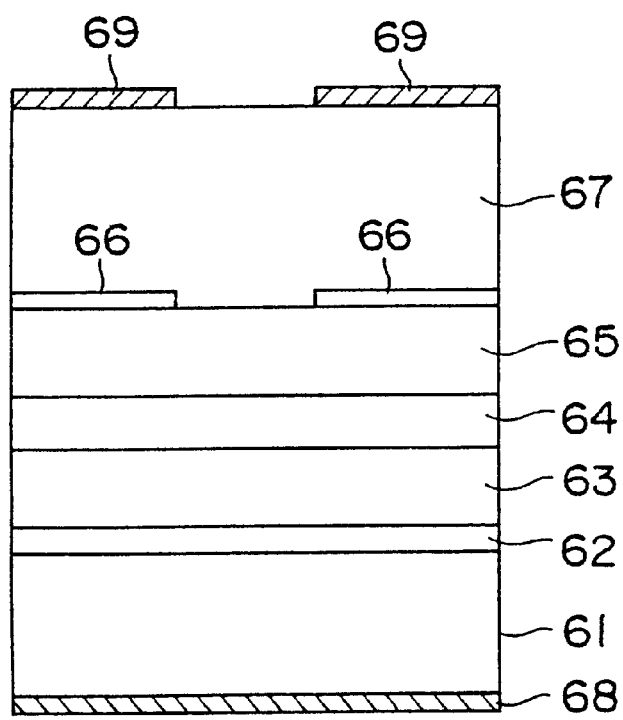
FIG. 9 is a cross sectional view showing an AlGaInP-based compound semiconductor light emitting device different from that of FIGS. 1, 4 through 6, and 8.
Figure 10A:
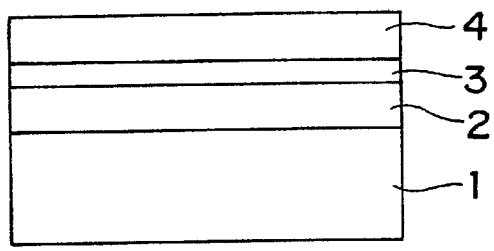
FIG. 10A–FIG. 10D are schematic view showing production steps of a prior art AlGaInP based semiconductor light emitting device formed on a GaP substrate.
Figure 10B:
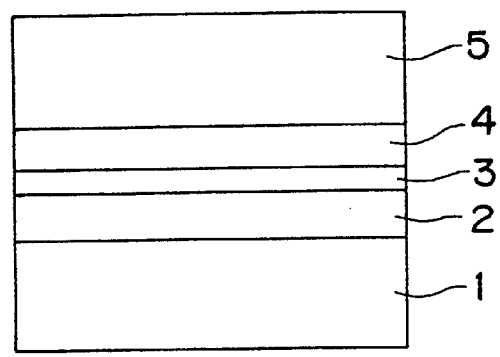
Figure 10C:
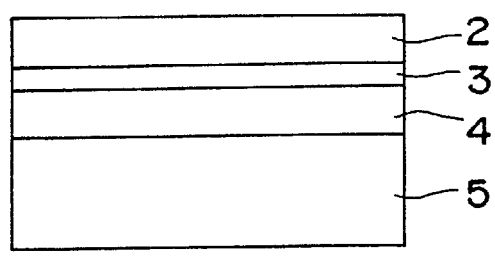
Figure 10D:
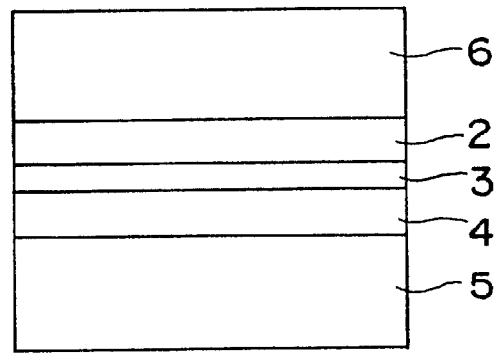

FIG. 9 is a cross sectional view showing an AlGaInP-based compound semiconductor light emitting device as a semiconductor light emitting device of this embodiment. Hereinbelow, description will be made of the AlGaInP-based compound semiconductor light emitting device in this embodiment with reference to FIG. 9. This embodiment is identical to the fifth embodiment except the point that the current interruption layer between the clad layer and the current diffusion layer as well as an electrode on the current diffusion layer are provided on the periphery.

First, on an n-GaP substrate 61, there are created in sequence in a laminated state an n-AlGaInP lattice distortion relaxation layer 62 (e.g. Si density of $5 \times 10^{17}$ cm$^{-3}$) with the film thickness of 0.5 μm; an n-$In_xAl_yGa_{1-x-y}P$ ($0 \leq x \leq 1$, $0 \leq y \leq 1$) clad layer 63 (e.g. x=0.5, y=0.5, Si density of $5 \times 10^{17}$ cm$^{-3}$) with the film thickness of 1.0 μm; an $In_xAl_yGa_{1-x-y}P$ ($0 \leq x \leq 1$, $0 \leq y \leq 1$) active layer 64 (e.g. x=0.5, y=0.2) with the film thickness of 0.5 μm; a p-$In_xAl_yGa_{1-x-y}P$ ($0 \leq x \leq 1$, $0 \leq y \leq 1$) clad layer 65 (e.g. x=0.5, y=0.5, Zn density of $5 \times 10^{17}$ cm$^{-3}$) with the film thickness of 1.0 μm; an n-$In_xAl_yGa_{1-x-y}P$ ($0<x<1$, $0 \leq y \leq 1$) current interruption layer 66 (e.g. x=0.01, y=0.01, Si density of $5 \times 10^{17}$ cm$^{-3}$) with the film thickness of 0.5 μm; and a p-$In_xAl_yGa_{1-x-y}P$ ($0<x<1$, $0 \leq y \leq 1$) current diffusion layer 67 (e.g. x=0.2, y=0.2, Zn density of $5 \times 10^{18}$ cm$^{-3}$) with the film thickness of 5 μm. Next, an electrode 68 is formed below the n-GaP substrate 61, and an electrode 69 is formed above the current diffusion layer 67. Through the steps stated above, an AlGaInP-based compound light-emitting device is completed.

In this embodiment, a current interruption layer 66 is disposed in the peripheral portion between the clad layer 65 and the current diffusion layer 67. Accordingly, with the effect of the current interruption layer 66, current supplied from the electrode 69 is concentrated in the central portion inside the current diffusion layer 67, by which light emission directivity is improved.

Although $In_xAl_yGa_{1-x-y}P$ is used as the current interruption layer 66 in the above-stated embodiment, it will be understood that the same effect can be implemented by using GaP or $In_xGa_{1-x}P$.

It goes without saying that in the fifth and sixth embodiments, the same effect as in the case of the fourth embodiment can be implemented by inclining the normal of the n-GaP substrate 61 surface with respect to the normal of the (100) plane toward the [011] direction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light emitting device comprising:
a light emitting portion comprising at least an active layer and clad layers, and a current diffusion layer formed above a substrate comprising GaP, and
wherein the current diffusion layer comprises $In_xGa_{1-x}P$ ($0.01 \leq X \leq 0.2$) where a composition ratio of In equals x.

2. A semiconductor light emitting device comprising:
a light emitting portion comprising an active layer and clad layers; and a current diffusion layer formed above a substrate comprising GaP, and
wherein the current diffusion layer comprises $In_xAl_yGa_{1-x-y}P$ ($0.01 \leq x \leq 0.2$, $0<y<1$) where a composition ratio of In equals x and a composition ratio of Al equals y.

3. The semiconductor light emitting device according to claim 1,
wherein a normal of the substrate surface inclines with respect to a normal of a (100) plane toward a [011] direction.

4. The semiconductor light emitting device according to claim 3,
wherein the normal of the substrate surface inclines with respect to the normal of the (100) plane toward the [011] direction by a range from 2 to 20 degrees.

5. The semiconductor light emitting device according to claim 1,
wherein the current diffusion layer is larger in an energy gap than the active layer.

6. The semiconductor light emitting device according to claim 1,
wherein the light emitting portion comprises $In_xAl_yGa_{1-x-y}P$ ($0 \leq x \leq 1, 0 \leq y \leq 1$) where a composition ratio of In equals to x, and a composition ratio of Al equals y.

7. The semiconductor light emitting device according to claim 1,
wherein the light emitting portion comprises $Al_xGa_{1-x}As$ ($0 \leq x \leq 1$) where a composition ratio of Al equals x.

8. The semiconductor light emitting device according to claim 1,
wherein the light emitting portion are comprises $In_xAl_yGa_{1-x-y}As$ ($0 \leq x \leq 1, 0 \leq y \leq 1$) where a composition ratio of In equals to x, and a composition ratio of Al equals y.

9. The semiconductor light emitting device according to claim 1,
wherein the light emitting portion comprises $In_xGa_{1-x}As_yP_{1-y}$ ($0 \leq x \leq 1, 0 \leq y \leq 1$) where a composition ratio of In equals to x, and a composition ratio of As equals y.

10. The semiconductor light emitting device according to claim 1,
wherein the light emitting portion comprises $Al_xGa_{1-x}As_ySb_{1-y}$ ($0 \leq x \leq 1, 0 \leq y \leq 1$) where a composition ratio of Al equals to x, and a composition ratio of As equals y.

11. The semiconductor light emitting device according to claim 1,
wherein the light emitting portion comprises $In_xAl_yGa_{1-x-y}N$ ($0 \leq x \leq 1, 0 \leq y \leq 1$) where a composition ratio of In equals to x, and a composition ratio of Al equals y.

12. The semiconductor light emitting device according to claim 1,
wherein a current interruption layer is provided in between the light emitting portion and the current diffusion layer.

13. The semiconductor light emitting device according to claim 12,
wherein the current interruption layer is larger in an energy gap than the active layer.

14. The semiconductor light emitting device according to claim 12,
wherein the current interruption layer is disposed in a center of an interface between the light emitting portions and the current diffusion layer.

15. The semiconductor light emitting device according to claim 12,
wherein the current interruption layer is disposed in a periphery of an interface between a light emitting portion and a current diffusion layer.

16. The semiconductor light emitting device according to claim 12, wherein the current interruption layer comprises GaP.

17. The semiconductor light emitting device according to claim 12,
wherein the current interruption layer comprises $In_xGa_{1-x}P$ ($0<X<1$) where a composition ratio of In equals x.

18. The semiconductor light emitting device according to claim 12, wherein the current interruption layer comprises $In_xAl_yGa_{1-x-y}P$ ($0<x<1, 0 \leq y \leq 1$) where a composition ratio of In equals x and a composition ratio of Al equals y.

19. The semiconductor light emitting device of claim 1, wherein the current diffusion layer has a doping density of about $5 \times 10^{18}$ cm$^{-3}$.

20. The semiconductor light emitting device of claim 2, wherein the current diffusion layer has a doping density of about $5 \times 10^{18}$ cm$^{-3}$.

* * * * *